(12) United States Patent
Moore

(10) Patent No.: US 8,698,882 B2
(45) Date of Patent: Apr. 15, 2014

(54) SAMPLE AND HOLD CIRCUIT

(75) Inventor: John Kevin Moore, Edinburgh (GB)

(73) Assignee: STMicroelectronics (Research & Development) Limited, Marlow, Buckinghamshire (GB)

(*) Notice: Subject to any disclaimer, the term of this patent is extended or adjusted under 35 U.S.C. 154(b) by 379 days.

(21) Appl. No.: 13/087,036

(22) Filed: Apr. 14, 2011

(65) Prior Publication Data

US 2011/0261177 A1    Oct. 27, 2011

(30) Foreign Application Priority Data

Apr. 16, 2010  (GB) .................................. 1006401.2

(51) Int. Cl.
*H04N 7/18* (2006.01)

(52) U.S. Cl.
USPC .................. 348/65; 348/66; 348/67; 348/68; 348/69; 348/70; 348/45; 348/82; 348/128; 348/356

(58) Field of Classification Search
USPC .......................................................... 348/65
See application file for complete search history.

(56) References Cited

U.S. PATENT DOCUMENTS

| | | | |
|---|---|---|---|
| 3,140,481 A * | 7/1964 | Hoffman | 341/108 |
| 4,041,484 A * | 8/1977 | Boleda et al. | 341/120 |
| 4,222,262 A * | 9/1980 | Batie et al. | 73/81 |
| 4,694,329 A * | 9/1987 | Belmares-Sarabia et al. | 348/586 |
| 5,162,670 A * | 11/1992 | Itakura et al. | 327/93 |
| 5,343,089 A * | 8/1994 | Itakura et al. | 327/94 |
| 5,376,841 A * | 12/1994 | Itakura et al. | 327/94 |
| 5,903,226 A * | 5/1999 | Suman et al. | 340/12.28 |
| 7,113,116 B2 * | 9/2006 | Brewer et al. | 341/122 |
| 7,804,434 B2 * | 9/2010 | Stoutjesdijk | 341/150 |
| 2003/0202630 A1 * | 10/2003 | Chen | 378/62 |
| 2006/0284998 A1 * | 12/2006 | Park et al. | 348/308 |
| 2007/0152076 A1 * | 7/2007 | Chiang et al. | 236/94 |
| 2007/0285296 A1 * | 12/2007 | Bilhan | 341/155 |
| 2008/0192126 A1 * | 8/2008 | Purcell et al. | 348/222.1 |
| 2009/0219058 A1 * | 9/2009 | Ohba | 327/94 |
| 2009/0237536 A1 * | 9/2009 | Purcell et al. | 348/294 |
| 2009/0284637 A1 * | 11/2009 | Parulski et al. | 348/333.12 |
| 2010/0157035 A1 * | 6/2010 | Purcell et al. | 348/65 |
| 2010/0253296 A1 * | 10/2010 | Huang et al. | 323/225 |

FOREIGN PATENT DOCUMENTS

| | | |
|---|---|---|
| EP | 1549050 A2 | 6/2005 |
| EP | 1928166 A2 | 6/2008 |
| EP | 1942663 A1 | 7/2008 |
| WO | WO-2007099620 A1 | 9/2007 |
| WO | WO-2008030327 A2 | 3/2008 |

OTHER PUBLICATIONS

UK Search Report mailed Aug. 11, 2010 for GB1006401.2 (2 pages).

(Continued)

*Primary Examiner* — Andy Rao
*Assistant Examiner* — Shan Elahi
(74) *Attorney, Agent, or Firm* — Gardere Wynne Sewell LLP

(57) ABSTRACT

A sample and hold circuit includes a plurality of capacitors, a network of switches and a control circuit. The control circuit is operable to control the network of switches so as to sample an incoming signal onto at least some of the plurality of capacitors. In such an operation, each capacitor takes a sample of the incoming signal at a different time. The sample and hold circuit outputs a signal corresponding to an average of the samples.

26 Claims, 2 Drawing Sheets

(56) References Cited

OTHER PUBLICATIONS

Kawahito, Shoji and Kawai, Nobuhiro: "Column Parallel Signal Processing Techniques for Reducing Thermal and RTS Noises in CMOS Image Sensors," Research Institute of Electronics, Shizuoka University, pp. 226-229, Oct. 2010.

Storm, G.G., et al.: "Continuous Time Column Parallel Readout for CMOS Image Sensor," STMicroelectronics, Imaging Division, 33 Pinkhill, Edinburgh, UK, pp. 58-61, Jun. 2007.

Kawahito, Shoji, et al.: "Noise Reduction Effects of Column-Parallel Correlated Multiple Sampling and Source-Follower Driving Current Switching for CMOS Image Sensors," Research Institute of Electronics, Shizuoka University (4 pages), Jun. 2009.

* cited by examiner

SAMPLE AND HOLD CIRCUIT

PRIORITY CLAIM

This application claims priority from Great Britain Application for Patent No. 1006401.2 filed Apr. 16, 2010, the disclosure of which is hereby incorporated by reference.

TECHNICAL FIELD

The invention relates to sample and hold circuits and in particular, but not exclusively, to sample and hold circuits for use in digital conversion of an analog signal, which may come from an image sensor.

BACKGROUND

Sample and hold circuits are well known in the art. In their most basic form, an electronic switch is used to alternately connect and disconnect a capacitor from an analog input, the capacitor being used to store an analog voltage when connected. In such arrangements only one sample is taken per input signal, and therefore noise fluctuations can be a problem. It is an aim of the present invention to address this issue.

SUMMARY

In an aspect there is provided a sample and hold circuit comprising: a plurality of capacitors; a network of switches and control means for said network of switches, said control means being operable to control said switches so as to sample an incoming signal onto at least some of said plurality of capacitors such that each sampling capacitor takes a sample at a different time, and to output a signal corresponding to an average of said samples.

BRIEF DESCRIPTION OF THE DRAWINGS

Embodiments will now be described, by way of example only, by reference to the accompanying drawings, in which.

DETAILED DESCRIPTION OF THE DRAWINGS

Figure 1:
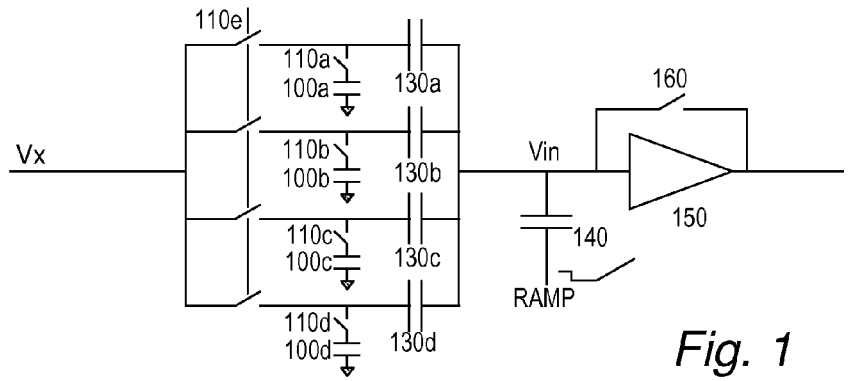
FIG. 1 shows an analog to digital converter using a sample and hold circuit according to a first embodiment.

FIG. 1 shows an analog to digital converter using a sample and hold circuit according to a first embodiment. It shows four sampling capacitors (which should be the same size) 100a-100d, five switches 110a-110e and four averaging capacitors (which should also be the same size) 130a-130d arranged as shown between pixel output Vx and the input of a continuous time comparator architecture for converting the pixel's analog output to its digital equivalent. European Patent Application EPI 956715A discloses such a continuous time ADC arrangement for an image sensor (the disclosure of said application being incorporated by reference). Shown here is ramp input RAMP, capacitor 140, comparator 150 and autozero feedback switch 160. The reason why switch 110e (switch 5) is shown as plurality of switches, one for each branch, with a single control, as opposed to a single switch at the pixel output is because, for Bayer scaling operation (where the outputs from multiple columns are averaged), the side of the capacitors 100a-100d shown as common here, is no longer common.

It can be seen that the capacitors 130a-130d in series, form a capacitive divider with capacitor 140, with the comparator input 150 at the divider output. In one embodiment, the capacitance of each of the capacitors 130a-130d is one quarter (reciprocal of the number of averaging capacitors) of the capacitance of capacitor 140.

One problem with known pixel architecture is that source follower noise is dominant in pixel readout. The sample and hold circuits described herein operate to benefit from reduction of this noise by taking multiple samples at the pixel output and averaging these out.

The circuit of FIG. 1 operates to take a black level sample (the pixel output when there is no light incident on the photodiode) and then a main signal sample, so that the black level output can be discounted. It operates as follows:

Black Sample:

In an initial state switches 110b, 110c, 110d and 110e are open. Switch 110a is closed. Pixel output is at Vx(black), the black level signal, and is not connected to sample and hold circuit.

In an initial state switches 110b, 110c, 110d and 110e are open. Switch 110a is closed. Pixel output is at Vx(black), the black level signal, and is not connected to sample and hold circuit.

Switch 110e (which operates all the switches in each parallel branch under single control) is closed, and at some time later opened again, thereby sampling Vx(black) on to capacitor 100a.

Switches 110a, 110c, 110d and 110e are open. Switch 110b is closed.

Switch 110e is closed, and at some time later opened again, thereby sampling Vx(black) on to capacitor 100b.

This process is repeated for switches 110c and 110d, so that Vx(black) is also sampled onto capacitors 100c and 110d.

The comparator 150 is auto-zeroed by closing switch 160.

Switch 110e is left open, and switches 110a, 110b, 110c and 110d are closed; connecting each sample and hold capacitor 100a-100d to its respective input capacitor 130a-130d. If node Vin was not connected to the comparator, the capacitive network at the comparator input would result in a voltage change proportional to the charge stored on the sampling capacitors. The connection to the comparator, which is in auto-zero mode, results in the fixing of Vin, meaning that the system "learns" the black signal level over the capacitors 100a to 100d.

The comparator is released from auto-zero by opening switch 160.

Signal Sample:

The pixel transfer gate is switched so that Vx is dependent on the light level at the pixel's photodiode, Vx(signal).

The same switch algorithm is performed as per the black sample (see, discussion above), this time sampling the Vx(signal).

Switch 110e is left open, and switches 110a, 110b, 110c and 110d are closed. With the comparator now out of auto-zero mode, the capacitive network at the comparator input results in a voltage change proportional to the charge stored on the sampling capacitors 100a-100d, resulting in an averaging effect at the comparator input Vin. At the same time the ramp signal RAMP should be applied, to convert the signal to a digital value.

It is worth noting that, as the ramp signal increases, the voltage levels on sample capacitors 100a-100d will alter slightly, depending on the ratio between the capacitors. However, the voltage on the comparator 150 input remains proportional to the charge on the sampling capacitors and so it still performs an averaging operation.

One advantage of this arrangement is that some of the charge injection onto the sample and hold capacitors 100a-100d resulting from opening switches 110a-110d (which tends to pull down) is compensated for when these switches are closed. This is helped by the fact that switch 110e ensures that the nodes are not driven in either case so that the increase in voltage will be approximately equal to the earlier decrease in voltage.

Figure 2:
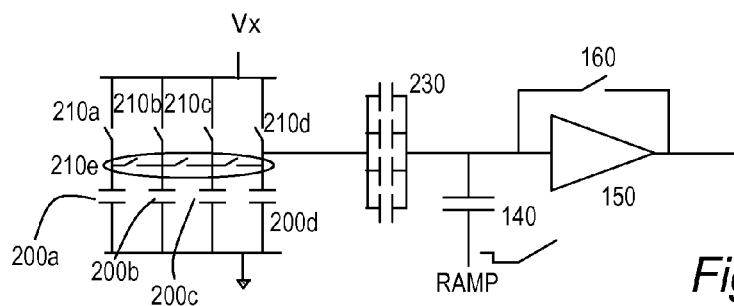
FIG. 2 shows an analog to digital converter using a sample and hold circuit according to a second embodiment.

FIG. 2 shows a further embodiment of the averaging sample and hold circuit. It shows four sampling/averaging capacitors (which should be the same size) 200a-200d, five switches 210a,-210e and four scaling capacitors (which should also be the same size) 230 arranged as shown between pixel output Vx and the input of a continuous time comparator architecture unchanged from FIG. 1.

The main difference is that the sampling capacitors 200a-200b are also used for the averaging of the signals. Capacitors 230 are split into four for Bayer Scaling timing modes, whereby a switch network is employed to enable each capacitor to connect to a different column. For the purpose of this example, they can be grouped and considered to be one capacitor.

The circuit operates as follows:
Black Sample:
In an initial state switch 210e is open. Switch 210e ties together all four capacitors 200a-200d, and may comprise a plurality of switches under a single control. Switches 210a, 210b, 210c, 210d are closed. This ensures that the signal on the column is settled when samples are taken. That this signal is allowed to settle means that the different duration of each sampling time is not a problem. What is important is that the switches 210a-210d close at different times, and therefore capture different noise.

Switches 210a, 210b, 210c, 210d are opened sequentially to sample Vx(black) onto capacitors 200a-200d;

With switches 210a, 210b, 210c, 210d open, switch 210e is closed thereby sharing charges between the capacitors 200a-200d (and averaging noise); and With the averaged VX(black) signal on the comparator 150 input, the comparator 150 should be auto-zeroed by closing switch 160.

When the comparator has settled, switch 160 is reopened.
Signal Sample:
The pixel transfer gate is switched so that Vx is dependent on the light level at the pixel's photodiode, Vx(signal);

Switch 210e is open. Switches 210a, 210b, 210c, 210d are closed;

Switches 210a, 210b, 210c, 210d are opened sequentially to sample Vx(signal) onto capacitors 200a-200d;

With switches 210a, 210b, 210c, 210d open, switch 210e is closed thereby sharing charges between the capacitors 200a-200d (and averaging noise); and With the averaged VX(signal) signal on the comparator 150 input, the ramp signal RAMP should be applied, so as to convert the signal to a digital value.

Figure 3:
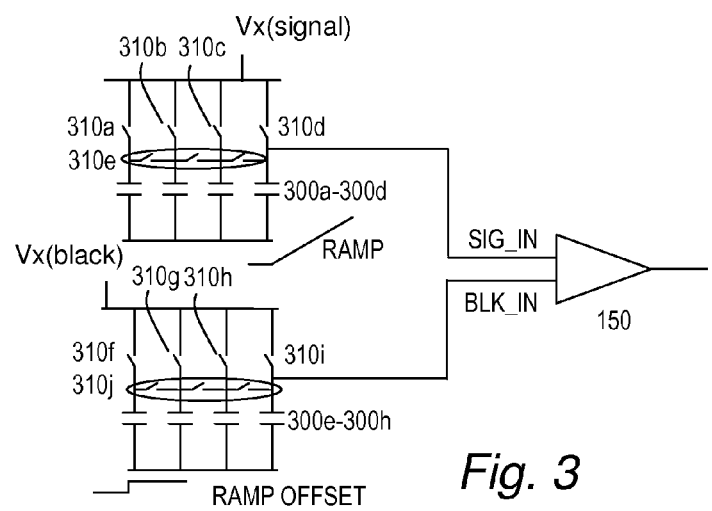
FIG. 3 shows a variation on the analog to digital converter of FIG. 2 using a sample and hold circuit according to a second embodiment.

FIG. 3 shows a further embodiment of an averaging sample and hold circuit whereby the black level signal from the pixel Vx(black) and the main pixel readout signal Vx(signal) are connected to different inputs of a comparator. The black level input to the comparator 150 results in an offset to the RAMP signal which corrects for the non-zero black level output from the pixel when performing the conversion. The circuit consists of two switch/capacitor networks essentially the same as that used in the embodiment of FIG. 2, one for each of the black level and signal inputs. The circuit operates as follows:

Black Sample:
In an initial state switch 310e is open. Switch 310e ties together all four capacitors 300a-300d, and may comprise a plurality of switches under a single control. Switches 310a, 310b, 310c, 310d are closed;

Switches 310a, 310b, 310c, 310d are opened sequentially to sample Vx(black) onto capacitors 300a-300d;

With switches 310a, 310b, 310c, 310d open, switch 310e is closed thereby sharing charges between the capacitors 300a-300d (and therefore averaging noise).

Signal Sample:
Switch 310j is open. Switch 310j ties together all four capacitors 300e-300h, and may comprise a plurality of switches under a single control. Switches 310f, 310g, 310h, 310i are closed;

Switches 310f, 310g, 310h, 310i are opened sequentially to sample Vx(black) onto capacitors 300e-300h

With switches 310f, 310g, 310h, 310i open, switch 310j is closed thereby sharing charges between the capacitors 300e-300h (and therefore averaging noise).

Apply offset to the black input (BLK_IN) and start Ramp signal to perform conversion.

Figure 4:
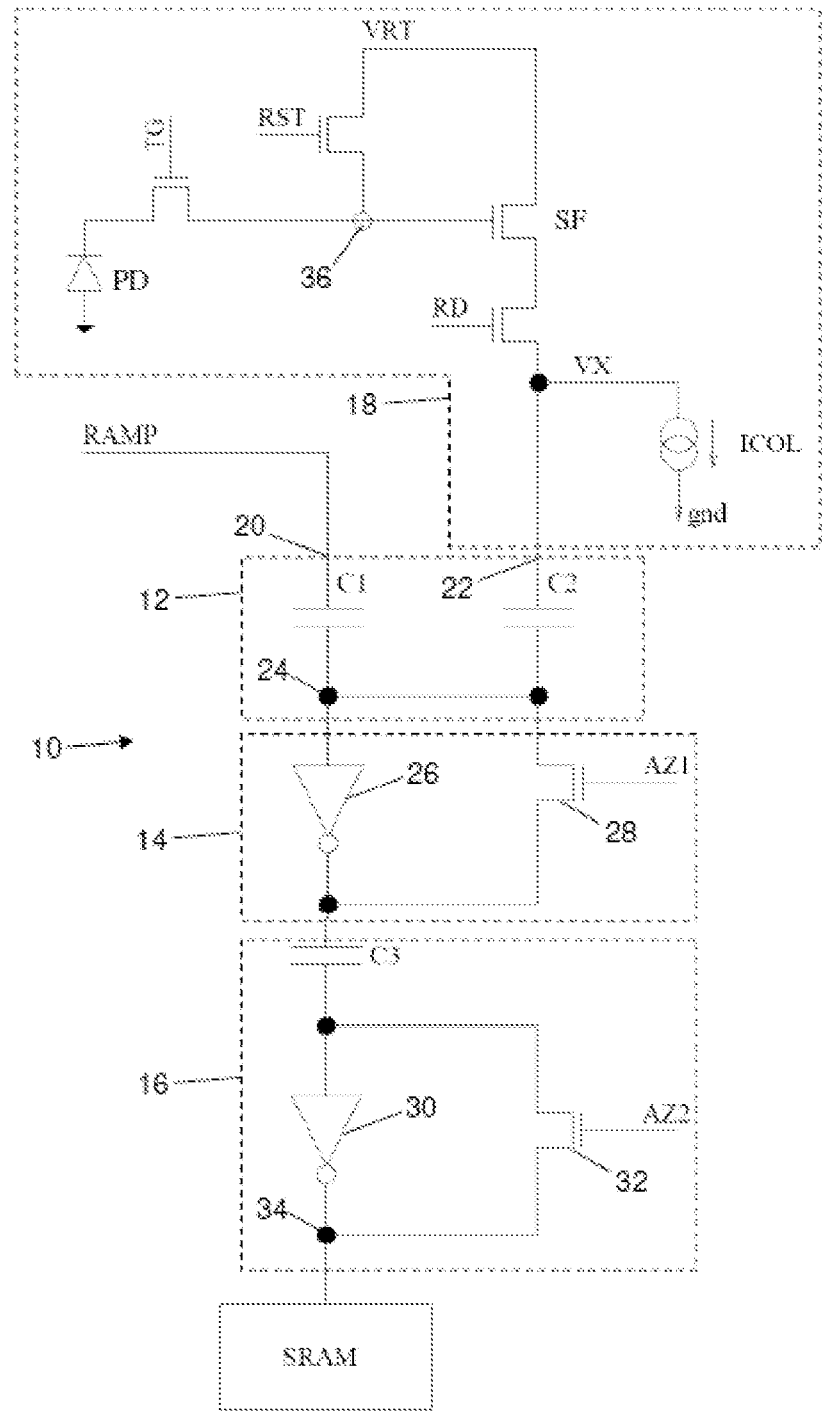
FIG. 4 shows an analog to digital converter circuit.

The above examples are explained in relation to a pixel output signal, and forming part of an ADC. FIG. 4 shows such an arrangement, according to one embodiment, which is also described below. This ADC arrangement (described European Patent Application EP1956715A—incorporated herein by reference), is shown with an associated pixel 18. Such a pixel forms part of a pixel array of an image sensor of a further embodiment of the invention. Such an image sensor may be used in mobile devices such as phone handsets and cameras, particularly for taking images. It could also be comprised within an endoscope apparatus, optical pointing device or ambient light sensor, amongst other possible uses.

An analog to digital converter ADC 10 comprises an input circuit 12 and a comparator, the comparator comprising an inverter circuit 14 and an output circuit 16. The input 22 to the input circuit 12 is from the column output line of a pixel array, one pixel 18 being shown by way of example.

The input circuit 12 comprises, in this example, a first capacitor C1 connected to a first input 20 and a second capacitor C2 connected to a second input 22. The first input 20 is connected to a ramp generator RAMP, which generates an appropriate time varying reference signal when required by the control means. The value of the time varying reference signal being known by the control means at any given time. The second input 22 is connected to the output of the pixel 18. The first and second capacitors C1, C2 are also connected to the input circuit's output node 24. The input circuit 12 allows correlated double sampling by autozeroing the comparator when 22 references the black pixel value. The inverter circuit 14, which could be a CMOS, NMOS or PMOS type inverter, comprises a first inverter 26 and, on a feedback loop from the output of the first inverter 26, a first transistor 28. The first transistor 28, in this instance, operates as a switch and is activated by an autozero signal AZ1 from the control means.

The output circuit 16 comprises a third capacitor C3, connected to the output of the inverter circuit 14, a second inverter 30 and, on a feedback loop from the output of the second inverter 30, a second transistor 32. The second transistor 32, in this instance, operates as a switch and is activated by an autozero signal AZ2 from the control means. The output circuit 16 stores the value of the pixel 18 in a memory SRAM.

The pixel 18 comprises a photodiode PD, a transfer gate transistor TG, a reset transistor RST, a source follower transistor SF and a read transistor RD. The operation of the pixel transistors are controlled by the control means. It should be noted that the current source, ICOL is strictly part of the column, not internal to the pixel.

The comparator (inverter circuit 14 and an output circuit 16) can be described as a summing comparator, in that it adds the two input values RAMP and VX. If RAMP+VX is greater than zero, the output of the comparator goes high, and, if RAMP+VX is less than zero, the output of the comparator goes low, where zero for RAMP is the value of RAMP when VX(black) is measured and zero for VX is VX(black).

The above examples and embodiments are provided for illustration only and other embodiments and variations can be envisaged without departing from the spirit and scope of the invention. For example, the embodiments above are explained in relation to a pixel output signal, and forming part of an ADC. However the sample and hold circuit disclosed herein can be used in any situation where a conventional sample and hold circuit is used, or where a sample and hold with averaging functionality is warranted or desirable. It is not in any way limited to use with a pixel, or as part of an ADC.

The invention claimed is:

1. Apparatus, comprising a sample and hold circuit comprising:
   a plurality of sampling capacitors coupled at first plates to a reference supply node;
   a network of switches including a first plurality of switches each coupled between an input node and a respective sampling node and a second plurality of switches each coupled between one of the sampling nodes and a second plate of a respective one of the sampling capacitors; and
   a control circuit for said network of switches, said control circuit operable to control said network of switches so as to sample an incoming signal at the input node onto said plurality of capacitors by sequentially activating the second plurality of switches while the first plurality of switches are simultaneously activated such that each sampling capacitor takes a sample of the incoming signal at a different time, and then simultaneously activating the second plurality of switches while the first plurality of switches are simultaneously deactivated to output a signal corresponding to an average of said samples.

2. The apparatus as claimed in claim 1 further comprising a plurality of averaging capacitors, each averaging capacitor coupled between the second plate of a respective one of the sampling capacitors and a common node at which the average of said samples is output.

3. The apparatus as claimed in claim 2 wherein a number of sampling capacitors equals a number of averaging capacitors.

4. The apparatus as claimed in claim 3 comprising a divider circuit including a first circuit portion comprising the averaging capacitors connected to the common node and a second circuit portion comprising at least one further capacitor coupled between the common node and a reference signal input node.

5. The apparatus as claimed in claim 2, further comprising a comparator having an input connected to said common node, the comparator operable to compare the average of said samples to a time varying signal.

6. The apparatus as claimed in claim 5, further comprising an image sensor comprising a pixel array, wherein said input node is configured to receive as said incoming signal an analog signal from a pixel of said pixel array, the signal having a varying level during a pixel readout period and having a noise level during a calibration period.

7. The apparatus as claimed in claim 5 wherein said comparator has a switched feedback loop, and a single input node for receiving both the average of said samples and the time varying signal.

8. The apparatus as claimed in claim 5 wherein said image sensor is a component of a mobile device.

9. The apparatus as claimed in claim 8, wherein the mobile device is selected from the group consisting of: a mobile phone, a personal digital assistant, a digital camera.

10. The apparatus as claimed in claim 5 wherein said image sensor is a component of an optical pointing device.

11. The apparatus as claimed in claim 5 wherein said image sensor is a component of an endoscope apparatus.

12. The apparatus as claimed in claim 5 wherein said image sensor is a component of an ambient light sensor.

13. Apparatus comprising a sample and hold circuit comprising:
   a plurality of sampling capacitors coupled at first plates to a reference supply node;
   a network of switches including a first plurality of switches each coupled between an input node and a second plate of a respective one of the sampling capacitors and a second plurality of switches each coupled between pairs of second plates of the sampling capacitors; and
   a control circuit for said network of switches, said control circuit operable to control said network of switches such that an input signal at the input node is sampled onto each of the sampling capacitors by sequentially activating the first plurality of switches while the second plurality of switches are simultaneously deactivated such that each sampling capacitor takes a sample of the input signal at a different time and then, with the input isolated by simultaneously deactivating the first plurality of switches, simultaneously activating said second plurality of switches so as to output a signal corresponding to an average of said samples.

14. The apparatus as claimed in claim 13 wherein the sampling capacitors are used for both sampling the input signal and for averaging the samples.

15. The apparatus as claimed in claim 13 wherein said second plurality of switches are operable to connect the second plates of the sampling outputs together at a common node.

16. The apparatus as claimed in claim 15, further comprising a comparator having an input connected to said common node, the comparator operable to compare the average of said samples to a time varying signal.

17. The apparatus as claimed in claim 16, further comprising an image sensor comprising a pixel array, wherein said input node is configured to receive as said input signal an analog signal from a pixel of said pixel array, the signal having a varying level during a pixel readout period and having a noise level during a calibration period.

18. The apparatus as claimed in claim 16 wherein said comparator has a switched feedback loop, and a single input node for receiving both the average of said samples and the time varying signal.

19. The apparatus as claimed in claim 16 further comprising one or more scaling capacitors coupled between said common node and the input of said comparator.

20. The apparatus as claimed in claim 17 wherein said image sensor is a component of a mobile device.

21. The apparatus as claimed in claim 20, wherein the mobile device is selected from the group consisting of: a mobile phone, a personal digital assistant, a digital camera.

22. The apparatus as claimed in claim 17 wherein said image sensor is a component of an optical pointing device.

23. The apparatus as claimed in claim 17 wherein said image sensor is a component of an endoscope apparatus.

24. The apparatus as claimed in claim 17 wherein said image sensor is a component of an ambient light sensor.

25. Apparatus comprising:
   a first sampling circuit, comprising:
      a first plurality of first sampling capacitors coupled at first plates to a first signal node configured to receive a ramp signal;
      a first network of switches including a first plurality of switches each coupled between a first input node and a second plate of a respective one of the first sampling capacitors and a second plurality of switches each coupled between pairs of second plates of the first sampling capacitors;
   a second sampling circuit, comprising:
      a second plurality of second sampling capacitors coupled at first plates to a second signal node configured to receive a ramp offset signal;
      a second network of switches including a third plurality of switches each coupled between a second input node and a second plate of a respective one of the second sampling capacitors and a second plurality of switches each coupled between pairs of second plates of the second sampling capacitors;
   a comparator having a first input coupled to an output of the first sampling circuit and a second input coupled to an output of the second sampling circuit; and
   a control circuit for said first and second networks of switches, said control circuit operable to control said first and second networks of switches such that input signals at the first and second input nodes are sampled onto each of the first and second sampling capacitors, respectively, by sequentially activating the first and third plurality of switches while the second and fourth plurality of switches are simultaneously deactivated such that each first and second sampling capacitor takes a sample at a different time and then, with the first and second input nodes isolated by simultaneously deactivating the first and third plurality of switches, simultaneously activating said second and fourth plurality of switches so as to output to the first input of the comparator a first signal corresponding to an average of said samples of the first input signal and output to the second input of the comparator a second signal corresponding to an average of said samples of the second input signal.

26. The apparatus of claim 25 wherein the first input signal is an active pixel signal and the second input signal is a black pixel signal.

* * * * *

UNITED STATES PATENT AND TRADEMARK OFFICE
CERTIFICATE OF CORRECTION

| | | |
|---|---|---|
| PATENT NO. | : 8,698,882 B2 | |
| APPLICATION NO. | : 13/087036 | |
| DATED | : April 15, 2014 | |
| INVENTOR(S) | : John Kevin Moore | |

It is certified that error appears in the above-identified patent and that said Letters Patent is hereby corrected as shown below:

In the Specification:

At column 1, line number 60, please replace [EPI 956715A] with -- EP1956715A --.

In the Claims:

At column 5, claim number 6, line number 66, please replace the word [incoming] with -- input --.

At column 6, claim number 15, line number 44, please replace the word [outputs] with -- capacitors --.

At column 6, claim number 17, line number 52, please replace the word [input] with -- incoming --.

Signed and Sealed this
Twelfth Day of August, 2014

Michelle K. Lee
*Deputy Director of the United States Patent and Trademark Office*